US008069389B2

(12) United States Patent
Yim et al.

(10) Patent No.: US 8,069,389 B2
(45) Date of Patent: Nov. 29, 2011

(54) ERROR CORRECTION CIRCUIT AND METHOD, AND SEMICONDUCTOR MEMORY DEVICE INCLUDING THE CIRCUIT

(75) Inventors: Yong-Tae Yim, Suwon-si (KR); Yun-Ho Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1171 days.

(21) Appl. No.: 11/776,727

(22) Filed: Jul. 12, 2007

(65) Prior Publication Data

US 2008/0052564 A1    Feb. 28, 2008

(30) Foreign Application Priority Data

Aug. 25, 2006  (KR) .................. 10-2006-0080854

(51) Int. Cl.
   *H03M 13/00*     (2006.01)
(52) U.S. Cl. ...................... 714/757; 714/762
(58) Field of Classification Search .................. 714/757, 714/762
   See application file for complete search history.

(56) References Cited

U.S. PATENT DOCUMENTS

| 4,961,192 | A | * | 10/1990 | Grimes ........................ 714/778 |
| 5,383,201 | A | * | 1/1995 | Satterlee et al. ............. 714/4.12 |
| 5,513,191 | A | * | 4/1996 | Takechi et al. ............... 714/752 |
| 5,577,054 | A | * | 11/1996 | Pharris ......................... 714/762 |
| 7,644,342 | B2 | * | 1/2010 | Shibata ......................... 714/773 |
| 2004/0075099 | A1 | * | 4/2004 | Matsumoto et al. ............ 257/98 |
| 2006/0136800 | A1 | | 6/2006 | Kawabata et al. |

FOREIGN PATENT DOCUMENTS

| JP | 2005011386 | 1/2005 |
| JP | 2005242797 | 9/2005 |
| JP | 2006179131 | 7/2006 |

* cited by examiner

*Primary Examiner* — M. Mujtaba K Chaudry
(74) *Attorney, Agent, or Firm* — Volentine & Whitt, PLLC

(57) ABSTRACT

An error correction circuit, an error correction method, and a semiconductor memory device including the error correction circuit are provided. The error correction circuit includes a partial syndrome generator, first and second error position detectors, a coefficient calculator, and a determiner. The partial syndrome generator calculates at least two partial syndromes using coded data. The first error position detector calculates a first error position using a part of the partial syndromes. The coefficient calculator calculates coefficients of an error position equation using the at least two partial syndromes. The determiner determines an error type based on the coefficients. The second error position detector optionally calculates a second error position based on the error type. The semiconductor memory device includes the error correction circuit, an error checking and correcting (ECC) encoder generating syndrome data based on information data and generating the coded data by combining the syndrome data with information data, and a memory core storing the coded data. Multi-bit ECC performance is maintained and ECC for a predetermined (1 or 2) or less number of error bits is quickly performed.

14 Claims, 6 Drawing Sheets

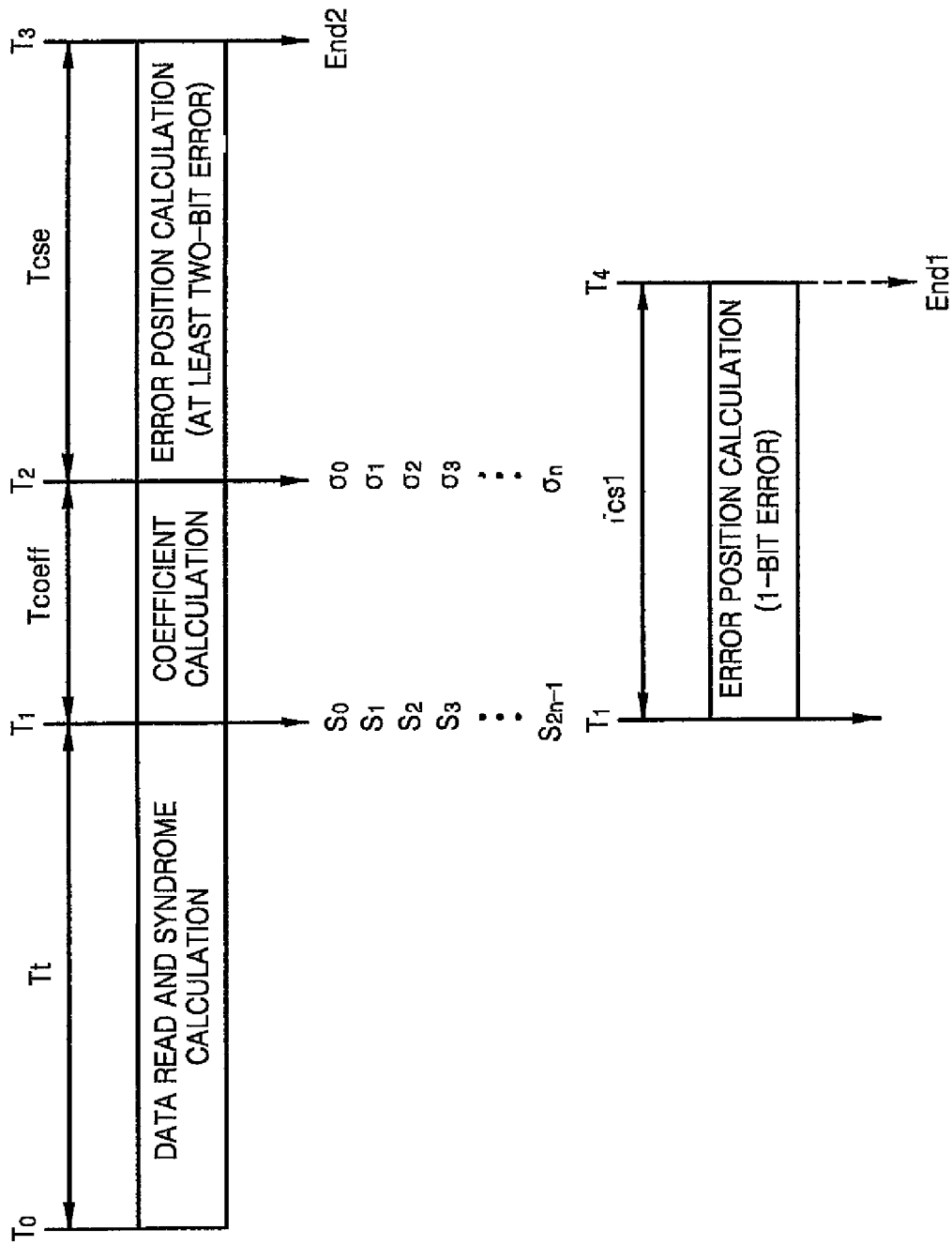

ERROR CORRECTION CIRCUIT AND METHOD, AND SEMICONDUCTOR MEMORY DEVICE INCLUDING THE CIRCUIT

BACKGROUND OF THE INVENTION

1. Field of the Invention

The present invention relates to error correction, and more particularly, to an error correction circuit, an error correction method, and a semiconductor memory device including the error correction circuit.

This application claims the benefit of Korean Patent Application No. 10-2006-0080854, filed on Aug. 25, 2006 in the Korean Intellectual Property Office, the disclosure of which is incorporated herein in its entirety by reference.

2. Description of the Related Art

With the increase in memory capacity of a semiconductor memory device, an error correction circuit which can recover an error in a memory cell is required. Conventional error correction circuits may be divided into circuits using a redundant memory cell and circuit using error checking and correction (ECC).

A semiconductor memory device including an error correction circuit using a redundant memory cell includes normal memory cells and redundant memory cells and replaces a defective memory cell having an error with a redundant memory cell when writing and/or reading data. The error correction circuit using a redundant memory cell is usually used for dynamic random access memory (DRAM).

A semiconductor memory device including an error correction circuit using ECC generates and stores redundant data (referred to as parity data or syndrome data) and detects and corrects errors occurring in data bits using redundant data. The error correction circuit using ECC is usually used for read-only memory (ROM) and especially used very often for flash memory including electrically erasable and programmable ROM (EEPROM) cells.

FIG. 1 is a schematic block diagram of a semiconductor memory device 100 including a conventional ECC circuit 120. The semiconductor memory device 100 includes a memory core 110, the ECC circuit 120, and a host interface and logic unit 130.

The memory core 110 is a block including a memory cell array for storing data. The ECC circuit 120 includes an ECC encoder 121 and an ECC decoder 123. The host interface and logic unit 130 performs data interface between a host 200 (e.g., a controller in a mobile device) and the memory core 110. The host interface and logic unit 130 can transmit and receive d-bit parallel data (where "d" is 2 or an integer greater than 2) to and from the host 200.

The ECC encoder 121 receives k-bit data through the host interface and logic unit 130, generates (n−k)-bit syndrome data using the received k-bit data, and adds the (n−k)-bit syndrome data to the k-bit data. Accordingly, n-bit data (which may be referred to as an ECC word) comprised of the received k-bit data and the (n−k)-bit syndrome data is input into the memory core 110.

When data stored in the memory core 110 is output, an ECC word, which is comprised of k-bit data and (n−k)-bit syndrome data, is read from the memory core 110. The ECC decoder 123 divides the ECC word by predetermined pattern data, generates syndrome data, and determines existence or non-existence of an error using the syndrome data. When an error is determined to exist, the ECC decoder 123 detects a position of the error, that is, a position of a bit having the error, and corrects the error bit. The correction of the error bit may be carried out by an error corrector included in a unit, e.g., the host interface and logic unit 130 within the semiconductor memory device 100 or by the host 200.

FIG. 2 is a timing diagram illustrating conventional error correction. The conventional error correction includes data read/syndrome calculation in a period Tt between times T0 and T1, coefficient calculation in a period Tcoeff between times T1 and T2, and error position calculation in a period Tcse between times T2 and T3.

During the data read/syndrome calculation, an ECC word (i.e., information data and syndrome data) is read from a memory cell array and partial syndromes $S_0$ through $S_{2n-1}$ are calculated. The data read/syndrome calculation requires a predetermined read time Tt. During the coefficient calculation, coefficients $\sigma_0$ through $\sigma_n$ necessary for producing an error position equation are calculated and a predetermined coefficient calculation time Tcoeff is required. During the error position calculation, the error position equation is solved to obtain a solution so that an error position is detected. The error position calculation requires a predetermined error position calculation time Tcse. Accordingly, an error correction cycle (or an ECC cycle) corresponds to the sum of the time periods Tt, Tcoeff, and Tcse, and is almost always constant regardless of the number of error bits.

Known circuits and methods for multi-bit ECC have many disadvantages. For example, a conventional ECC decoder is designed and implemented based on a maximum number of correctable error bits. A conventional multi-bit ECC decoder requires more processing time than single bit ECC decoder. Moreover, the error correction cycle is directly related to data access time (the time for a host to read data from a semiconductor memory device). As a consequence, conventional multi-bit ECC circuits and methods may result in significantly slower data read times from memory. Faster multi-bit ECC circuits and methods are needed.

SUMMARY OF THE INVENTION

Embodiments of the present invention decrease data read time and increase read performance by selectively performing alternative error position calculations based on a number of detected error bits.

An embodiment of the present invention provides an error correction circuit that includes: at least two error position detectors configured to be operated in parallel and to have different error position calculation times; a determiner configured to determine an error type; and a main controller coupled to the at least two error position detectors and the determiner, the main controller configured to determine a final error position based on the error type and an output from the at least two error position detectors.

Another embodiment of the present invention provides a semiconductor memory device including the above-described error correction circuit. The semiconductor memory device may further include an error checking and correcting (ECC) encoder configured to generate syndrome data based on information data and to generate the error correction coded data by adding the syndrome data to the information data, and a memory core coupled to the ECC encoder and configured to store the coded data.

Further embodiments of the present invention provide an error correction method includes: reading coded data; calculating a plurality of partial syndromes using the coded data; and calculating a plurality of bit position equation coefficients using the plurality of partial syndromes.

BRIEF DESCRIPTION OF THE DRAWINGS

The above and other features and advantages of the present invention will become more apparent by describing in detail exemplary embodiments thereof with reference to the attached drawings in which:

FIG. 6 is a timing diagram illustrating how error correction is performed in a time domain, according to some embodiments of the present invention.

DETAILED DESCRIPTION OF THE INVENTION

Figure 1:
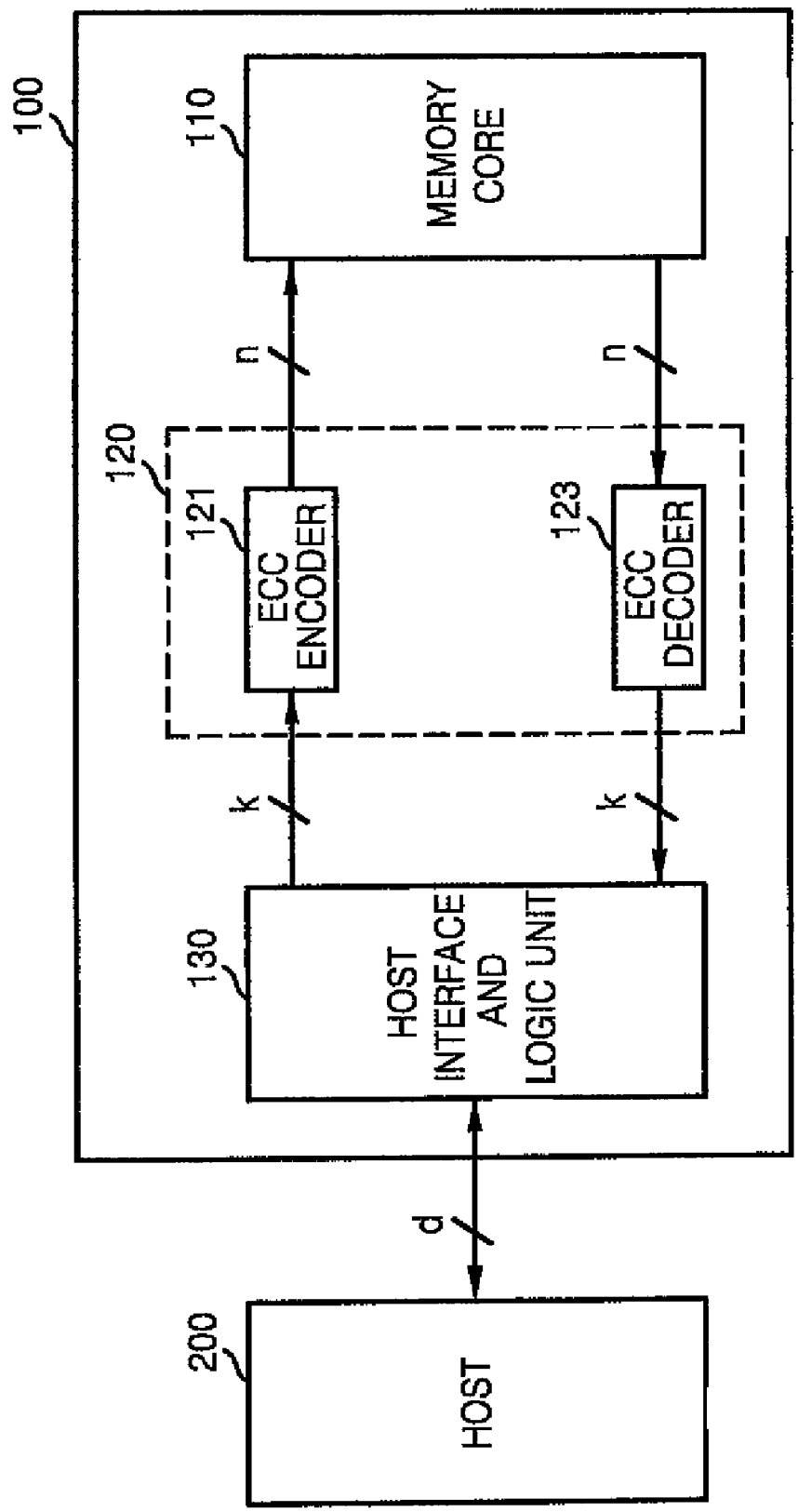
FIG. 1 is a schematic block diagram of a semiconductor memory device including a conventional error checking and correction (ECC) circuit.
Figure 2:
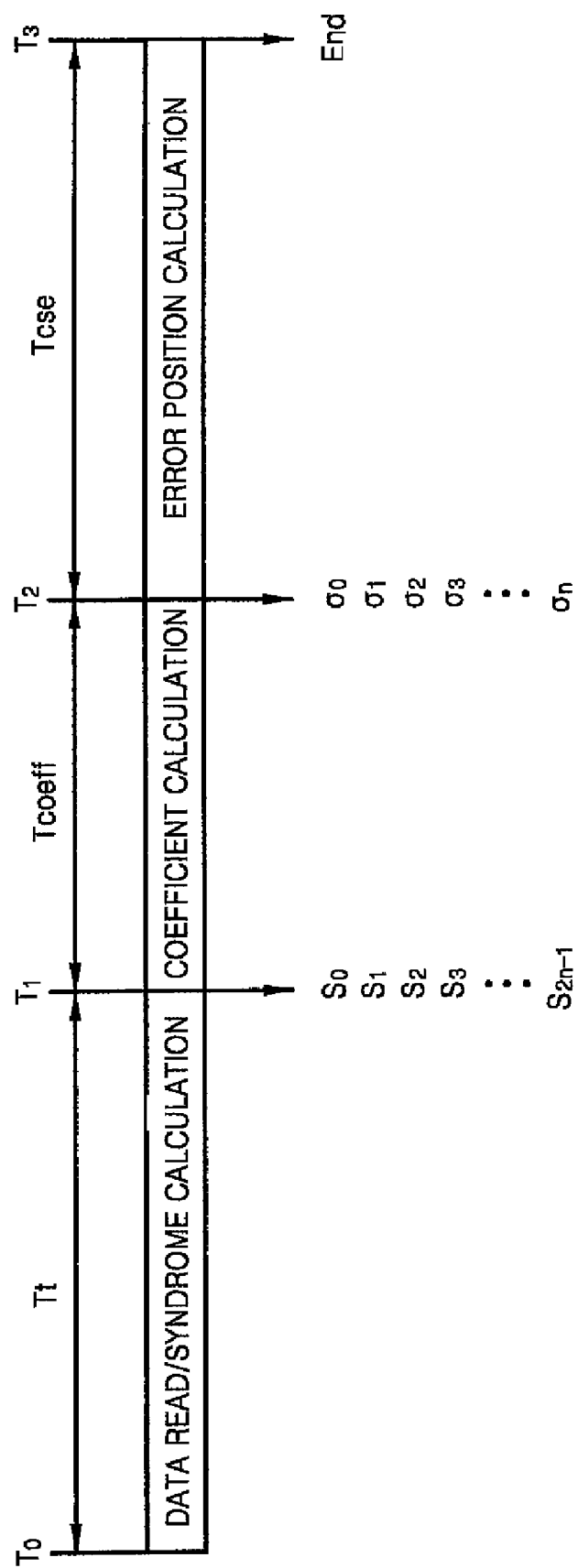
FIG. 2 is a timing diagram illustrating conventional error correction.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

Figure 3:
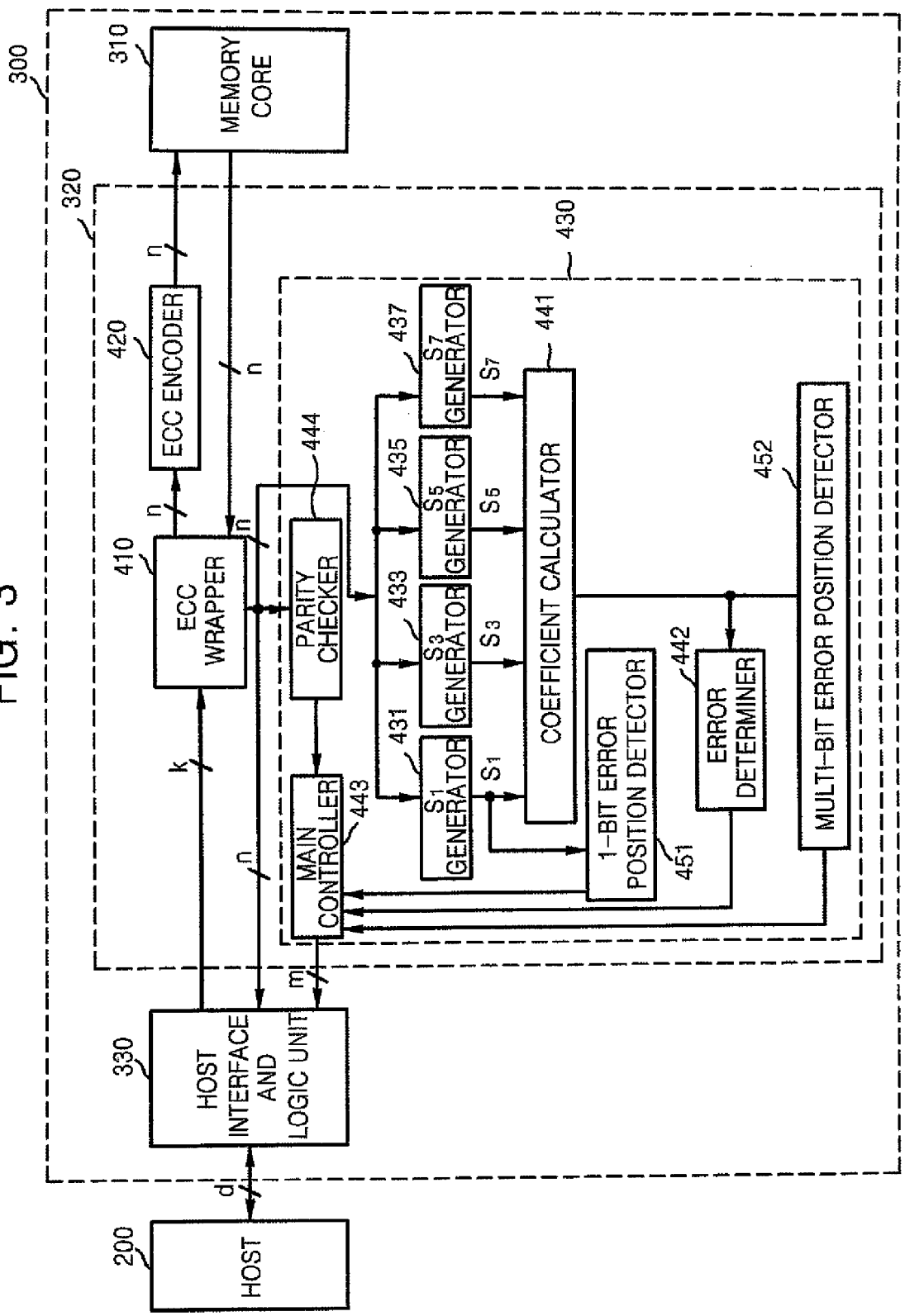
FIG. 3 is a block diagram of a semiconductor memory device according to some embodiments of the present invention.

FIG. 3 is a block diagram of a semiconductor memory device 300 according to some embodiments of the present invention. The semiconductor memory device 300 includes a memory core 310, an error checking and correction (ECC) circuit 320, and a host interface and logic unit 330. ECC circuit 320 is coupled between the memory core 310 and the host interface and logic unit 330.

The memory core 310 includes a memory cell array for storing data. The memory cell array may include, for example, electrically erasable and programmable read only memory (EEPROM) cells having a floating gate, but the present invention is not restricted thereto.

The host interface and logic unit 330 performs control and buffering for interface between a host 200 (e.g., a controller in a mobile device or a computer) and the ECC circuit 320. The host interface and logic unit 330 may include an error corrector (not shown) which corrects an error in coded data based on a result of error detection performed by the ECC circuit 320.

The host interface and logic unit 330 may include memory (not shown) like static random access memory (SRAM). In this case, when the host 200 writes data to the SRAM, the data is encoded by the ECC circuit 320 and then recorded in the memory core 310 (e.g., a flash memory core). Thereafter, an error in data read from the memory core 310 is detected and corrected by the ECC circuit 320 and error-corrected data is stored in the SRAM. As a result, the host 200 reads the error corrected data stored in the SRAM. The host interface and logic unit 330 can transmit and receive d-bit parallel data (where "d" is 2 or an integer greater than 2) from and to the host 200.

The ECC circuit 320 includes an ECC wrapper 410 coupled to an ECC encoder 420 and an ECC decoder 430. The ECC wrapper 410 receives k-bit information data (where "k" is 2 or an integer greater than 2) from the host interface and logic unit 330. The ECC wrapper 410 then adds (n−k)-bit dummy data to the k-bit information data. "n−k" is 1 or an integer greater than 1, and each bit of the dummy data has a predetermined logic value. The ECC wrapper 410 then outputs n-bit data in series or parallel to the ECC encoder 420. For example, the k-bit information data may be 4096 bits, the (n−k)-bit dummy data may be 53 bits, and the n-bit data may be 4149 bits.

Figure 4:
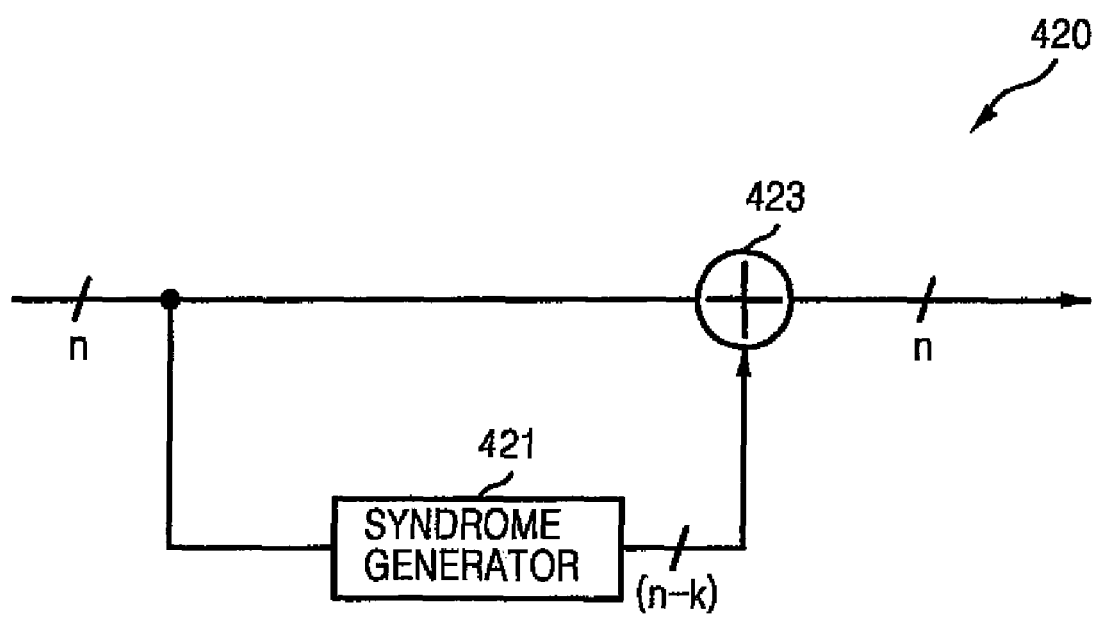
FIG. 4 is a logic diagram illustrating operation of the ECC encoder in FIG. 3, according to some embodiments of the present invention.

FIG. 4 is a logic diagram illustrating operation of the ECC encoder 420 in FIG. 3, according to some embodiments of the present invention. Referring to FIG. 4, the ECC encoder 420 includes a syndrome generator 421 and an exclusive OR (XOR) operator 423.

The syndrome generator 421 receives n-bit data from the ECC wrapper 410 and divides the received n-bit data by predetermined data to generate (n−k)-bit remainder (or syndrome) data. The predetermined data is typically referred to as a generator polynomial G(x). The integer "n−k" is determined based on a maximum number of correctable error bits and/or a maximum number of detectable error bits.

The XOR operator 423 performs an XOR operation on the n-bit data received from the ECC wrapper 410 and the syndrome data to generate n-bit coded data. When the information data, the syndrome data, and the coded data are represented with I(x), S(x), and C(x), respectively, the relationship among the data is expressed by Equation (1):

$$S(x)=Ix^{(n-k)}(x) \% G(x),$$

$$C(x)=x^{(n-k)}I(x)+S(x)=Q(x)G(x), \quad (1)$$

where $x^{(n-k)}(x)$ is a value obtained by shifting the k-bit information data I(x) by (n−k) bits in a most significant bit (MSB) direction, % G(x) indicates modulo G(x), and Q(x) is a quotient when C(x) is divided by G(x). When "n−k" is 53, G(x) is a 53rd-order polynomial and S(x) is a 52nd-order polynomial.

The n-bit coded data (also referred to as an ECC word) is input to the memory core 310. A cell array area of the memory core 310 may be divided into an area for storing information data and an area for storing syndrome data. Alternatively, the n-bit coded data may be stored in the memory cell array without identifying the information data area and the syndrome data area.

When coded data stored in the memory core 310 is output, n-bit coded data (including k-bit information data and (n−k)-bit parity data) is read from the memory core 310 and is then input to the ECC wrapper 410. The ECC wrapper 410 may buffer the n-bit coded data and output the n-bit coded data to the ECC decoder 430.

The ECC decoder 430 determines whether an error bit exists in coded data received from the ECC wrapper 410 and also detects an error position, i.e., the position of the error bit. In alternative embodiments, the ECC decoder 430 may also correct the error bit in the coded data based on the detected error position. In such cases, an error corrector (not shown) may be included in the ECC decoder 430.

In the illustrated embodiment, the ECC decoder 430 includes first through fourth partial syndrome generators 431, 433, 435, and 437, a coefficient calculator 441, a 1-bit error position detector 451, a multi-bit error position detector 452, an error determiner 442, and a main controller 443. The ECC decoder 430 may further include a parity checker 444, which may be an even parity checker or an odd parity checker.

The first through fourth partial syndrome generators 431, 433, 435, and 437 are coupled to the coefficient calculator 441. The 1-bit error position detector 451 is coupled to the first syndrome generator 431 and the main controller 443. The multi-bit error position detector 452 and the error determiner 442 are each coupled to the coefficient calculator 441 and the main controller 443.

Although the first through fourth partial syndrome generators 431, 433, 435, and 437 are described as separate components, they can also be collectively described as a single partial syndrome generator having multiple partial syndrome outputs. The first through fourth partial syndrome generators 431, 433, 435, and 437 divide n-bit coded data output from the memory core 310 by their predetermined data, respectively, so as to generate partial syndromes $S_1$, $S_3$, $S_5$, and $S_7$. When the n-bit coded data output from the memory core 310 is represented with R(x) and the predetermined data, i.e., partial generation polynomials of the respective first through fourth partial syndrome generators 431, 433, 435, and 437 are represented with $m_1(x)$, $m_3(x)$, $m_5(x)$, and $m_7(x)$, the relationship between the data is expressed by Equation (2):

$$S_1(x)=R(x) \% m_1(x),$$
$$S_3(x)=f\{R(x) \% m_3(x)\},$$
$$S_5(x)=f\{R(x) \% m_5(x)\},$$
$$S_7(x)=f\{R(x) \% m_7(x)\}, \quad (2)$$

where $S_1(x)$, $S_3(x)$, $S_5(x)$, and $S_7(x)$ correspond to the partial syndromes $S_1$, $S_3$, $S_5$, and $S_7$ generated by the first through fourth partial syndrome generators 431, 433, 435, and 437, respectively, and % indicates a modulo operation. As shown in Equation (2), $S_1(x)$ may be directly calculated from $R(x) \% m_1(x)$. And, $S_3(x)$ $S_5(x)$ and $S_7(x)$ may be calculated using $R(x) \% m_3(x)$, $R(x) \% m_5(x)$ and $R(x) \% m_7(x)$, respectively.

In addition, the relationship between the generation polynomial G(x) of the syndrome generator 421 included in the ECC encoder 420 and the partial generation polynomials $m_1(x)$, $m_3(x)$, $m_5(x)$, and $m_7(x)$ of the first through fourth partial syndrome generators 431, 433, 435, and 437 may be defined as Equation (3):

$$G(x)=m_1(x)*m_3(x)*m_5(x)*m_7(x), \quad (3)$$

where "*" indicates Galois multiplication. When G(x) is a 53rd-order polynomial and S(x) is a 52nd-order polynomial, $m_1(x)$, $m_3(x)$, $m_5(x)$, and $m_7(x)$ are each a 13th-order polynomial and $S_1(x)$, $S_3(x)$, $S_5(x)$, and $S_7(x)$ are each a 12th-order polynomial.

When the first through fourth partial syndromes $S_1$, $S_3$, $S_5$, and $S_7$ are all zero (0), no error exists in coded data. If any one or more of the first through fourth partial syndromes $S_1$, $S_3$, $S_5$, and $S_7$ is not 0, then an error exists in at least one bit of the coded data. When an error occurs, the coefficient calculator 441 begins calculating coefficients $\sigma_1$, $\sigma_2$, $\sigma_3$, and $\sigma_4$ of an error position equation using the partial syndromes $S_1$, $S_3$, $S_5$, and $S_7$. Simultaneously, the 1-bit error position detector 451 begins calculating the position of a 1-bit error using only the first partial syndrome $S_1$. The 1-bit error position detector 451 may be implemented by a simple circuit so that the 1-bit error position detector 451 completes its calculation before the multi-bit error position detector 452 can complete multi-bit error position calculations. Although the 1-bit position calculator 451 may complete its operation ahead of the coefficient calculator 441, the components can be said to operate in parallel because they begin operations at substantially the same time.

The error position equation has the reciprocal of an error bit as a root. The relationship between the coefficients $\sigma_1$, $\sigma_2$, $\sigma_3$, and $\sigma_4$ of the error position equation and the partial syndromes $S_1$, $S_3$, $S_5$, and $S_7$ may be obtained using diverse algorithms. Equations (4) and (5) are exemplary error position equations that express the relationship.

Equation (4) is an example of the error position equation for 1-bit error correction:

$$\sigma_1 x+1=0, \quad (4)$$

where $\sigma_1=S_1$ and a reciprocal of a root satisfying first-order Equation (4) indicates a 1-bit error position.

Equation (5) is an example of the error position equation for 2-bit error correction:

$$\sigma_2 x^2+\sigma_1 x+1=0, \quad (5)$$

where $\sigma_1=S_1$, $\sigma_2=(S_1^3+S_3)/S_1$, and a reciprocal of a root satisfying second-order Equation (5) indicates a 2-bit error position.

For 3- or more-bit error correction, coefficients of the error position equation may be calculated in a similar manner to that described above.

According to some embodiments of the present invention, the coefficient calculator 441 calculates the coefficients $\sigma_1$, $\sigma_2$, $\sigma_3$, and $\sigma_4$ according to the error position equation which can correct a maximum of 4 bits of error.

The error determiner 442 determines an error type based on the coefficients $\sigma_1$, $\sigma_2$, $\sigma_3$, and $\sigma_4$ calculated by the coefficient calculator 441. In particular, the error determiner 442 determines whether a detected error is a 1-bit error (i.e., a first error type) or a multi-bit error (i.e., a second error type). For example, when the coefficient $\sigma_1$ of a first-order equation is not 0 and the coefficients $\sigma_2$, $\sigma_3$, and $\sigma_4$ of other order equations are all 0, the error position equation is a first-order equation and the number of error bits is 1. If the coefficient $\sigma_2$ of a second-order equation is not 0 and the coefficients $\sigma_3$, and $\sigma_4$ of third- and fourth-order equations are 0, the error position equation is a second-order equation and the number of error bits is 2.

When the error determiner 422 determines the presence of a 1-bit error, the position of the error bit is determined by the 1-bit error position detector 451. In this instance, the multi-bit error position detector 452 may not be operated. A 1-bit error position calculated by the 1-bit error position detector 451 may be referred to as a first error position.

When the error determiner 422 detects the presence of multiple bit errors, the positions of error bits are determined by the multi-bit error position detector 452. Multi-bit error positions calculated by the multi-bit error position detector 452 may be referred to as second error positions.

The 1-bit error position detector 451 and the multi-bit error position detector 452 may detect the position of an error bit based on the error position equations.

The 1-bit error position detector 451 is a quick error position calculator that is optimized to 1-bit ECC and is an exclusive circuit for 1-bit error detection. The 1-bit error position detector 451 detects the position of one bit having an error in n-bit coded data based on a first-order error position equation, e.g., Equation (4) Since the coefficient $\sigma_1$ of the first-order error position equation is the same as the first partial syndrome $S_1$, the first-order error position equation can be determined once the first partial syndrome $S_1$ is generated by the first partial syndrome generator 431, regardless of a result of calculation by the coefficient calculator 441. Accordingly, the 1-bit error position detector 451 may begin operation in parallel with the coefficient calculator 441 once the first partial syndrome $S_1$ is generated.

The multi-bit error position detector 452 detects the positions of 2 or more error bits using the coefficients $\sigma_1$, $\sigma_2$, $\sigma_3$, and $\sigma_4$ calculated by the coefficient calculator 441. According to some embodiments of the present invention, the multi-bit error position detector 452 is an error position calculator which can detect the positions of at least two error bits and at most four error bits.

Multi-bit error position detector 452 can detect error positions using error position equations. In this case, it is necessary to solve an $i^{th}$-order error position equation (where i=1, 2, 3, or 4) according to the number of error bits. Since it is difficult to obtain a general solution of a fourth-order error position equation, a Chien search algorithm may be used to determine the roots of the polynomial. The Chien search algorithm makes use of the fact that the roots will be powers of primitive element $\alpha$. A test root can therefore be expressed as $\alpha^{-j}$ over the range of j=0 to j=(n-1):$\alpha^{-0}$, $\alpha^{-1}$, $\alpha^{-2}$, $\alpha^{-3}$... $\alpha^{-(n-1)}$. When $\alpha^{-j}$ satisfies an error position equation the $j^{th}$ bit is determined to have an error. This operation may be performed with respect to each code of n size in order to determine whether substituting j (altering j over the range of 0 to n-1) into error position equation repeatedly as n times satisfies the equation.

The main controller 443 determines a final error bit position based on the detection result of the 1-bit error position detector 451 (i.e., the first error position) or the detection result of the multi-bit error position detector 452 (i.e., the second error positions). The main controller 443 determines a final error bit position according to the first error position when the error determiner 422 determines the first error type and the main controller 443 determines final error bit positions according to the second error positions, ignoring the detection result of the 1-bit error position detector 451, when the error determiner 422 determines the second error type. In addition, the main controller 443 may further refer to a signal output from the parity checker 444 in order to more accurately determine existence or non-existence of an error and an error position.

After the main controller 443 has determined a final error bit position or positions, the main controller 443 may provide the determined final error bit position(s) to the host interface and logic unit 330. The host interface and logic unit 330 may then correct one or more bit errors by inverting a logic value of the one or more erroneous bits.

Alternatively, the host interface and logic unit 330 may transmit the error position information and the n-bit coded data (or just the k-bit information data) to the host 200. In this instance, the host 200 may correct one or more errors by inverting a logic value of bits based on the error bit position information from the main controller 443.

Figure 5:
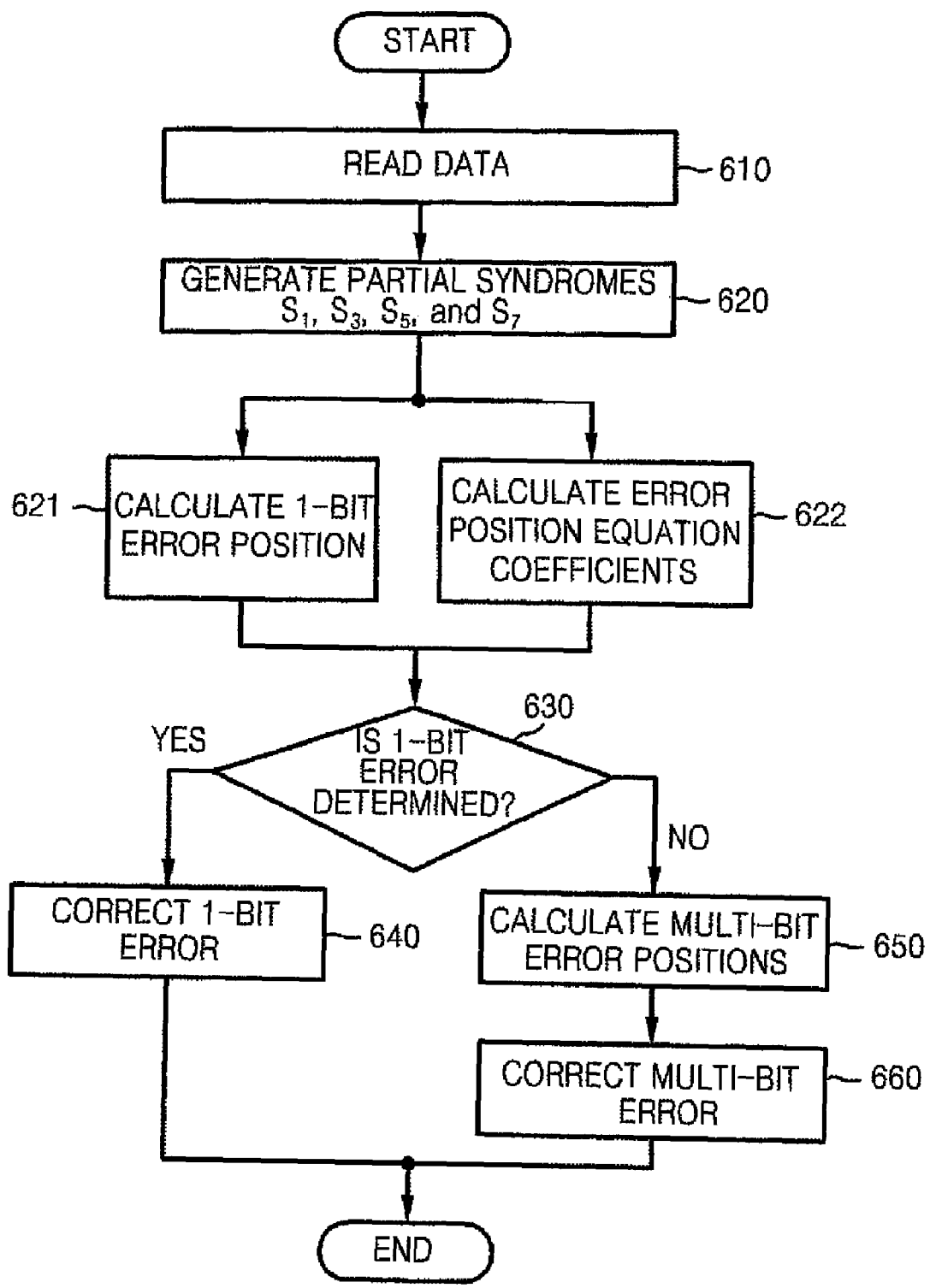
FIG. 5 is a flowchart of an error correction method according to some embodiments of the present invention.

FIG. 5 is a flowchart of an error correction method according to some embodiments of the present invention. The error correction method illustrated in FIG. 5 may be performed by the ECC circuit 320 illustrated in FIG. 3. The error correction method will be described with reference to FIGS. 3 through 5 below.

Prior to operation 610, coded data is generated by combining syndrome data with information data, and the coded data has been stored in the memory core 310. In operation 610, the coded data is read from the memory core 310. In operation 620, first through fourth partial syndromes $S_1$, $S_3$, $S_5$, and $S_7$ are generated using the coded data. The calculations in operation 620 may be performed by the first through fourth partial syndrome generators 431, 433, 435, and 437.

In case of 1-bit error correction (i.e., 1-bit ECC), an error position can be immediately detected using only the first partial syndrome $S_1$. Accordingly, as soon as the first partial syndrome $S_1$ is calculated in operation 620, the 1-bit error position detector 451 may begin to calculate an error position in operation 621. The coefficient calculator 441 may calculate coefficients of an error position equation in operation 622, and operations 621 and 622 may be performed simultaneously. After the coefficient calculator 441 completes the calculation of the coefficients of the error position equation, an error type is determined in operation 630 based on the coefficients calculated in operation 630. The error determiner 442 may perform operation 630. If the error type is determined as a 1-bit error, i.e., the first error type, then the 1-bit error is corrected in operation 640 based on 1-bit error position information which has already been calculated in operation 621. If the error type is determined as a multi-bit error, i.e., the second error type, then the multi-bit error detector 452 can calculate multiple bit error positions in operation 650, and the multiple bit errors may be corrected in operation 660. The host interface and logic unit 330 and/or the host 200 may perform operations 640 and 660.

Although the method illustrated in FIG. 5 is described above with reference to components illustrated in FIG. 3, other combinations of components may be used to implement the method, according to design choice. Moreover, the method illustrated in FIG. 5 could be implemented in software or in a combination of hardware and software. Likewise, any one or more functional components illustrated with reference to the semiconductor memory device 300 in FIG. 3 could be implemented in software.

FIG. 6 is a timing diagram illustrating how error correction is performed in a time domain, according to some embodiments of the present invention.

During the data read and syndrome calculation between times T0 and T1, an ECC word (i.e., information data and syndrome data) is read from a memory cell array, and partial syndromes S0, $S_1$, S2...S2n-1 are calculated. This operation requires a predetermined read time duration of Tt. However, according to some embodiments of the present invention, the coefficient calculation and 1-bit error position calculation are simultaneously commenced at time T1.

An error type is determined based on calculated coefficients σ0 through σn. If a 1-bit error is determined, then multi-bit error calculation is omitted. Accordingly, in case of 1-bit error, an ECC cycle may end at time T4. In such a case, the ECC cycle time corresponds to the sum of time Tt for the data read and syndrome calculation and time Tcs1 for the 1-bit error position calculation, i.e., Tt+Tcs1, which is much shorter than time required in a case where two or more bit errors occur.

In the case of multi-bit error, the ECC cycle corresponds to "Tt+Tcoeff+Tcse." However, since the ECC cycle for 1-bit error correction in embodiments of the invention is greatly reduced compared to a conventional ECC cycle, the average ECC cycle time may be significantly less where there is a combination of multi-bit errors and single-bit errors.

In the above embodiments of the present invention, an error correction circuit including a calculator that exclusively calculates a 1-bit error position. In other words, errors are classified into 1-bit errors and multi-bit errors. In an alternative embodiment of the invention, a one or two bit error may be classified into a first error type, and a three or more bit error may be classified into a second error type. In such an embodiment, when a one or two bit error occurs, the position(s) of error bit(s) may be quickly detected using a 2-bit error position calculator based on Equation (5). When three or more bit errors occur, error positions may be detected using a multi-bit error position detector such as multi-bit error position detector 452.

In further embodiments of the present invention, errors may be classified into three or more types, e.g., a first error type, a second error type, and a third error type, and error position detectors for each of the respective error types may be provided so that an error position is most quickly detected with respect to the first error type and an error position is second most quickly detected with respect to the second error type. The error position detectors for the respective error types may be operated in parallel and may have different error position detection times.

According to embodiments of the present invention, multi-bit ECC performance is maintained without additional parity data, and ECC for a predetermined (e.g., 1 or 2) or less number of error bits can be quickly done. As a result, average ECC cycle time is reduced, and data read speed is increased.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. An error correction circuit comprising:
   a partial syndrome generator that receives coded data and generates a plurality of partial syndromes;
   a coefficient calculator that receives the plurality of partial syndromes and generates a corresponding plurality of coefficients;
   an error determiner that determines in relation to the plurality of coefficients whether the coded data includes less than or equal to a number of errors, or more than the number of errors;
   a first error position detector that operates to detect a first error position when the coded data includes less than or equal to the number of errors;
   a second error position detector that operates to detect a second error position when the coded data includes more than the number of errors,
   wherein a first calculation time required for the first error position detector to detect at least one error position is less than a second calculation time required for the second error position detector to detect at least one error position.

2. The error correction circuit of claim 1,
   wherein the first error position detector is directly coupled to the partial syndrome generator to receive a portion of the plurality of partial syndromes and is configured to calculate a first error position using the portion of the plurality of partial syndromes; and
   the second error position detector is coupled to the coefficient calculator to receive the plurality of coefficients and is configured to calculate the second error position using the plurality of coefficients.

3. The error correction circuit of claim 2, wherein the first error position detector and the coefficient calculator are configured to operate in parallel in relation to the partial syndrome generator.

4. The error correction circuit of claim 1, wherein the number of errors is 1, the first error position detector is a single bit error position detector, and the second error position detector is a multi-bit error position detector.

5. The error correction circuit of claim 1, wherein the number of errors is 1, the first error position detector is a single bit error position detector directly coupled to a first partial syndrome generator among a plurality of partial syndrome generators arranged within the partial syndrome generator and configured to calculate a single error bit position in the coded data, and
   the second error position detector is a multi-bit error position detector configured to calculate at least two error bit positions in the coded data.

6. The error correction circuit of claim 1, wherein the number of errors is 2, the first error position detector is multi-bit error position detector configured to calculate two or one error bit positions in the coded data, and
   the second error position detector is a multi-bit error position detector configured to calculate at least three error bit positions in the coded data.

7. The error correction circuit of claim 1, further comprising a first error corrector configured to correct up to the number of errors in the coded data in response to the first error position.

8. The error correction circuit of claim 7, further comprising a second error corrector configured to correct more than the number of errors in the coded data in response to the second error position.

9. The error correction circuit of claim 1, further comprising an error corrector configured to correct the coded data based on the first error position or the second error position.

10. The error correction circuit of claim 1, wherein the error correction circuit further comprises a main controller that generates a final error position in response to the first error position, the second error position, and the determination signal.

11. A semiconductor storage device comprising:
    a memory core that provides coded data; and
    an error correction circuit (ECC), comprising:
       a partial syndrome generator that receives the coded data and generates a plurality of partial syndromes;
       a coefficient calculator that receives the plurality of partial syndromes and generates a corresponding plurality of coefficients;
       an error determiner that determines in relation to the plurality of coefficients whether the coded data includes less than or equal to a number of errors, or more than the number of errors and generate a determination signal indicating whether the coded data includes less than or equal to a number of errors, or more than the number of errors;
       a first error position detector that operates to detect a first error position when the coded data includes less than or equal to the number of errors;
       a second error position detector that operates to detect a second error position when the coded data includes more than the number of errors,
       wherein a first calculation time required for the first error position detector to detect the at least one error position is less than a second calculation time required for the second error position detector to detect the at least one error position.

12. The semiconductor storage device of claim 11, wherein the memory core comprises electrically erasable and programmable read only memory (EEPROM) cells.

13. The semiconductor storage device of claim 11, wherein the ECC further comprises:
    a main controller that generates a final error position in response to the first error position, the second error position, and the determination signal; and a host interface and logic unit coupled to the main controller and the ECC encoder, and configured to transmit the coded data read from the memory core and error position data to a host.

14. The semiconductor storage device of claim 11 is a memory card or a solid state drive.

* * * * *